United States Patent
Kim et al.

(10) Patent No.: US 12,249,375 B2
(45) Date of Patent: Mar. 11, 2025

(54) MEMORY DEVICE AND METHOD OF OPERATING THE SAME

(71) Applicant: SK hynix Inc., Icheon-si (KR)

(72) Inventors: Dong Jun Kim, Icheon-si (KR); Hea Jong Yang, Icheon-si (KR); Jong Wook Kim, Icheon-si (KR); Pyung Hwa Kim, Icheon-si (KR); Yong Hwan Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 203 days.

(21) Appl. No.: 17/994,061

(22) Filed: Nov. 25, 2022

(65) Prior Publication Data
US 2024/0021245 A1 Jan. 18, 2024

(30) Foreign Application Priority Data
Jul. 15, 2022 (KR) .................. 10-2022-0087243

(51) Int. Cl.
*G11C 16/04* (2006.01)
*G11C 16/20* (2006.01)
*G11C 16/24* (2006.01)
*G11C 16/30* (2006.01)

(52) U.S. Cl.
CPC .......... *G11C 16/0433* (2013.01); *G11C 16/20* (2013.01); *G11C 16/24* (2013.01); *G11C 16/30* (2013.01)

(58) Field of Classification Search
CPC ..... G11C 16/0433; G11C 16/20; G11C 16/24; G11C 16/30; G11C 16/32; G11C 16/0483; G11C 16/08; G11C 16/12; G11C 16/14; G11C 16/26; G06F 3/0659; G06F 3/0679

USPC ..................................................... 365/185.18
See application file for complete search history.

(56) References Cited

U.S. PATENT DOCUMENTS

| | | | |
|---|---|---|---|
| 11,328,761 B2* | 5/2022 | An .......... | G11C 16/34 |
| 2016/0019969 A1* | 1/2016 | Lim .......... | G11C 16/08 |
| | | | 365/185.12 |
| 2018/0166111 A1* | 6/2018 | Yu .......... | G11C 7/225 |
| 2021/0210146 A1* | 7/2021 | Lee .......... | G11C 16/30 |
| 2022/0230690 A1* | 7/2022 | Chai .......... | G11C 16/26 |

FOREIGN PATENT DOCUMENTS

KR   1020160059174 A   5/2016
KR   1020190120502 A   10/2019

* cited by examiner

*Primary Examiner* — Huan Hoang
(74) *Attorney, Agent, or Firm* — WILLIAM PARK & ASSOCIATES LTD.

(57) ABSTRACT

Provided herein is a memory device that may include a string, a voltage generation circuit, a page buffer, and a channel initializing circuit. The string may include select transistors and memory cells coupled in series between a bit line and a source line. The page buffer may be configured to precharge or discharge the bit line. The voltage generation circuit may be configured to apply a turn-on voltage or a turn-off voltage to select lines coupled to the select transistors, apply at least one operating voltage to word lines coupled to the memory cells, or discharge the select lines or the word lines. The channel initializing circuit may be configured to control the voltage generation circuit and the page buffer so as to initialize a channel of the string when an operation performed on the memory cells is completed or is suspended before being completed.

27 Claims, 12 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2022-0087243, filed on Jul. 15, 2022, in the Korean Intellectual Property Office, the entire disclosure of which is incorporated herein by reference.

BACKGROUND

1. Technical Field

Various embodiments of the present disclosure generally relate to a semiconductor device and a method of operating the semiconductor device, and more particularly to a memory device and a method of operating the memory device.

2. Related Art

A memory system may include a storage device in which to store data and a controller to control the storage device.

The storage device may include one or more memory devices, and the controller may output commands for controlling the memory devices. For example, when a request is received from a host, the controller may generate a command corresponding to the request and transmit the command to the corresponding memory device. The command may be for performing a program operation, a read operation, an erase operation, a suspend command for suspending an operation being performed on the memory device, a resume command for resuming an operation suspended on the memory device, etc. For example, when the controller sends a command for an erase operation to the memory device, the memory device may perform the erase operation in response.

Additionally, some operations may be suspended. For example, while an erase operation is being performed on the memory device, a read operation may need to be performed in response to a read request from the host. The controller may transmit to the memory device a suspend command to temporarily suspend the erase operation being performed on the memory device. The controller may then transmit a read command to the memory device, and the memory device may perform the read operation in response to the operation command. When the read operation is completed, the controller may transmit to the memory device a resume command to resume the suspended erase operation. The memory device may then resume the erase operation in response to the resume command.

When the suspended erase operation is performed on the memory device in response to the resume command, word lines of the memory device may be discharged. During this process, a channel voltage of a memory block may be excessively decreased. This may happen because the voltages of the word lines need to be decreased to resume the erase operation, and the channel voltages may be decreased due to channel coupling between the word lines and channels. When the channel voltages are excessively decreased, the reliability of the memory device may be affected.

SUMMARY

Various embodiments of the present disclosure are directed to a memory device to improve the reliability of a resumed operation and a method of operating the memory device.

An embodiment of the present disclosure may provide for a memory device. The memory device may include a string including select transistors and memory cells coupled in series between a bit line and a source line, a voltage generation circuit configured to provide a turn-on voltage or a turn-off voltage to select lines coupled to the select transistors, and provide at least one operating voltage to word lines coupled to the memory cells, or discharge the select lines or the word lines, a page buffer configured to precharge or discharge the bit line, and a channel initializing circuit configured to control the voltage generation circuit and the page buffer to initialize a channel of the string when an operation performed on the memory cells is completed or is suspended before being completed.

An embodiment of the present disclosure may provide for a method of operating a memory device. The method may include performing an operation that is one of a program operation, a read operation, or an erase operation on a memory block, increasing a voltage of a channel of the memory block after the operation is completed, allowing the channel to float after the channel voltage is increased, and when the channel is floating, discharging word lines coupled to the memory block.

An embodiment of the present disclosure may provide for a method of operating a memory device. The method may include performing an operation in response to a received operation command, wherein the operation command is a command to perform one of a program operation, a read operation, or an erase operation on a memory block, suspending the operation in response to receiving a suspend command, initializing channels of strings included in the memory block in response to receiving a resume command, and when the channels of the strings are initialized, resuming the program operation.

DETAILED DESCRIPTION

Figure 1:
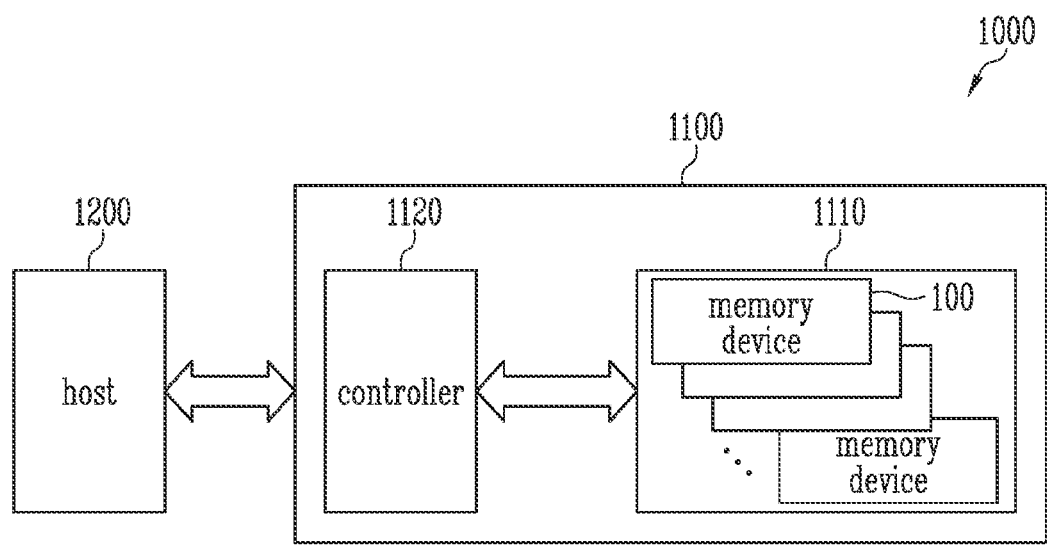
FIG. 1 is a diagram illustrating an example memory system that may include an embodiment of the disclosure.

Specific structural or functional descriptions and drawings disclosed herein describe example embodiments. The present disclosure should not be construed as being limited to embodiments disclosed in the drawings, described below, or claimed. The disclosed embodiments may be modified in various forms and/or replaced with other equivalent embodiments.

Hereinafter, it will be understood that, although the terms "first" and "second" may be used to describe various elements, these terms are used to distinguish one element from another element, and do not necessarily specify order.

FIG. 1 is a diagram illustrating an example memory system that may include an embodiment of the disclosure.

Referring to FIG. 1, a memory system 1000 may include a memory module 1100 and a host 1200.

The memory module 1100 may include a memory group 1110 and a controller 1120. The memory module 1100 may store or output data under the control of a host 1200 such as, for example, a mobile phone, a smartphone, an MP3 player, a laptop computer, a desktop computer, a game console, a TV, a tablet PC, an in-vehicle infotainment system, etc.

The memory module 1100 may be one of various types of memory modules with a communication interface for communicating with the host 1200. For example, the memory module 1100 may be implemented as a solid state drive (SSD), a multimedia card such as an MMC, an embedded MMC (EMMC), a reduced size MMC (RS-MMC), a micro-MMC, a secure digital card such as an SD, a mini-SD, or a micro-SD, a universal serial bus (USB) memory module, a universal flash storage (UFS) device, a personal computer memory card international association (PCMCIA) card-type memory module, a peripheral component interconnection (PCI) card-type memory module, a PCI express (PCI-E) card-type memory module, a compact flash (CF) card, a smart media card, a memory stick, etc.

The memory module 1100 may be manufactured in any of various types of package forms. For example, the memory module 1100 may be manufactured as package on package (POP), system in package (SIP), system on chip (SOC), multi-chip package (MCP), chip on board (COB), wafer-level fabricated package (WFP), wafer-level stack package (WSP), etc.

The memory group 1110 may include at least one memory device 100 that stores data. The memory device 100 may operate in response to commands from the controller 1120. The memory device 100 may include a memory cell array comprising memory cells that store data.

Each memory cell may be implemented as a single-level cell capable of storing 1 bit of data, a multi-level cell capable of storing 2 bits of data, a triple-level cell capable of storing 3 bits of data, or a quad-level cell capable of storing 4 bits of data. In addition, other types of memory cells may store 5 or more bits of data.

The memory cell array may include memory blocks. A memory block may be the unit by which data is erased. Each of the memory blocks may include a plurality of memory cells. One memory block may include a plurality of pages. A page may be the unit by which data is programmed to the memory device 100 or the unit by which data stored in the memory device 100 is read.

The memory device 100 may be implemented as, for example, a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory, a resistive RAM (RRAM), a phase-change RAM (PRAM), a magnetoresistive RAM (MRAM), a ferroelectric RAM (FRAM), a spin transfer torque RAM (SU-RAM), etc.

The memory device 100 may receive a command CMD and an address ADDR from the controller 1120, and may access a memory block in the memory cell array. Accordingly, the memory device 100 may perform an operation indicated by the command CMD on the memory block selected by the address ADDR. For example, the memory device 100 may perform a program operation, a read operation, or an erase operation in response to a command CMD that may be a program command, a read command, or an erase command, respectively. For example, in response to the program command, the memory device 100 may program data DATA to a memory block selected by the address ADDR. In response to the read command, the memory device 100 may read data from a memory block selected by the address ADDR and output the read data. In response to the erase command, the memory device 100 may erase data in a memory block selected by the address ADDR.

A suspend command may be used to suspend an operation currently being performed in the memory device 100, and a resume command may be used to resume the suspended operation. In accordance with the present embodiment, when the resume command is received, the memory device 100 may perform a channel initializing operation on a selected memory block to improve the reliability of the operation to be resumed. Accordingly, after the resume command is received, the suspended operation may be resumed when the channel initializing operation is completed.

The controller 1120 may control the overall operation of the memory module 1100.

When power is applied to the memory module 1100, the controller 1120 may execute firmware (FW) to control the memory module 1100. For example, when the memory device 100 is a flash memory device, the controller 1120 may execute a flash translation layer (FTL) FW to control communication between the host 1200 and the memory device 100.

For example, the controller 1120 may receive data and a logical address from the host 1200 to be stored in the memory device 100. The controller 1120 may then translate the logical address to a physical address of the memory device 100 in which to store the received data.

Accordingly, in response to a request from the host 1200, the controller 1120 may control the memory device 100 to perform a program operation, a read operation, an erase operation, suspend the operation being performed on the memory device, or resume the suspended operation. During a program operation, the controller 1120 may provide a program command, a physical block address, and data to the memory device 100. During a read operation, the controller 1120 may provide a read command and a physical block address to the memory device 100. During an erase operation, the controller 1120 may provide an erase command and a physical block address to the memory device 100.

The controller 1120 may also perform background operations for managing the memory device 100 independently of whether requests are received from the host 1200. For example, the controller 1120 may generate a command, an address, and data to transmit to the memory device 100 to perform background operations such as wear leveling, garbage collection, auto refresh, read reclaim operations, etc. The controller 1120 may be configured to control two or more memory devices 100.

The host 1200 may communicate with the memory module 1100 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIE), nonvolatile memory express (NVME), compute express link (CXL), universal flash storage (UFS), secure digital (SD), multimedia card (MMC), embedded MMC (EMMC), dual in-line memory module (DIMM), registered DIMM (RDIMM), load reduced DIMM (LRDIMM), etc.

Figure 2:
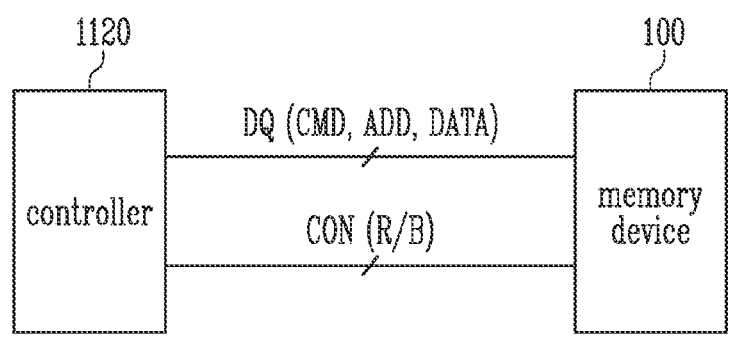
FIG. 2 is a diagram illustrating an example communication method between a controller and a memory device.

FIG. 2 is a diagram illustrating an example communication method between a controller and a memory device.

Referring to FIG. 2, the controller 1120 may transmit a command CMD, an address ADD, and data DATA to the memory device 100 via input/output lines DQ. The memory device 100 may output data DATA read from the memory device 100 to the controller 1120 via the input/output lines DQ. Various embodiments may have separate groups of lines for DATA, ADDR, and CMD while other embodiments may multiplex some or all of DATA/ADDR/CMD. The memory device 100 may transmit a ready/busy signal R/B indicating the state of the memory device 100 to the controller 1120 via control lines CON.

The command CMD transmitted by the controller 1120 to the memory device 100 may be an operation command, a suspend command, or a resume command. The operation command may be a program command, a read command, or an erase command. The suspend command may temporarily suspend a program operation or an erase operation being performed on the memory device 100.

For example, when a read operation needs to be preferentially performed in response to a request from a host while a program operation or an erase operation is being performed on the memory device 100, the controller 1120 may transmit the suspend command to the memory device 100. The memory device 100 may then suspend the program operation or the erase operation currently being performed. Then, when the controller 1120 transmits a read command and a physical address to the memory device 100, the memory device 100 may perform a read operation on a memory block corresponding to the physical address, and may output the read data as DATA to the controller 1120 via the input/output lines DQ.

The memory device 100 may output the ready/busy signal R/B having a low level on the control lines CON while a program, read, or erase operation is being performed, and may output the ready/busy signal R/B having a high level on the control lines CON otherwise. The controller 1120 may determine the state of the memory device 100 by the ready/busy signal R/B transmitted from the memory device 100. In addition to the ready/busy signal R/B, various other signals may be transmitted via the control lines CON.

Figure 3:
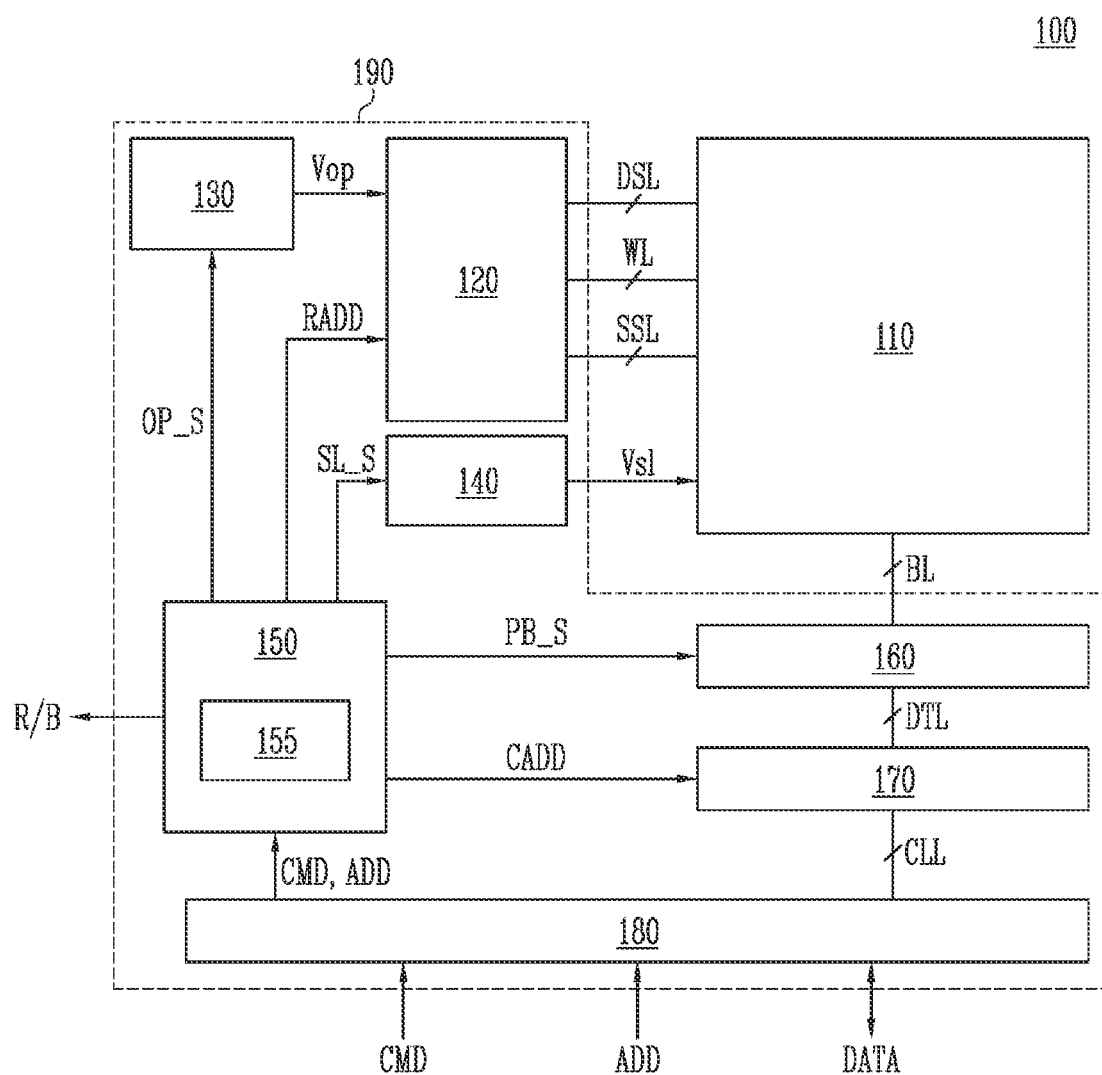
FIG. 3 is a diagram illustrating an example memory device.

FIG. 3 is a diagram illustrating an example memory device.

Referring to FIG. 3, the memory device 100 may include a memory cell array 110 and a peripheral circuit 190.

The memory cell array 110 may include memory cells in which to store data. In an embodiment, the memory cell array 110 may be a three-dimensional (3D) memory cell array. Each memory cell may store 1 or more bits of data depending on the technology used for fabricating the memory cells. The memory cells may form memory cell strings where each memory cell string may be coupled between a bit line BL and a source select line SSL. A memory cell string may also be referred to as a string.

The peripheral circuit 190 may perform program operations of storing data in the memory cell array 110, a read operation of outputting data stored in the memory cell array 110, and an erase operation of erasing data stored in the memory cell array 110. The peripheral circuit 190 may include a row decoder 120, a voltage generation circuit 130, a source line driver 140, a control circuit 150, a page buffer group 160, a column decoder 170, and an input/output circuit 180.

The row decoder 120 may be coupled to the memory cell array 110 by drain select lines DSL, word lines WL, and source select lines SSL. The row decoder 120 may transfer operating voltages Vop to the drain select lines DSL, the word lines WL, and the source select lines SSL in response to a row address RADD. When dummy lines are coupled to the memory cell array 110, the row decoder 120 may also transfer the operating voltages Vop to the dummy lines in response to the row address RADD.

The voltage generation circuit 130 may generate various operating voltages Vop to be used for a program, a read, or an erase operation in response to an operation signal OP_S. For example, the voltage generation circuit 130 may generate operating voltage(s) Vop in response to the operation signal OP_S, and may output appropriate operating voltage(s) Vop in response to the operation signal OP_S. The operating voltages Vop may include a program voltage, a turn-on voltage, a turn-off voltage, a ground voltage, a read voltage, etc. The program voltage may be applied to a selected word line during a program operation, and may be used to increase threshold voltages of the memory cells. The turn-on voltage may be used to turn on drain select transistors coupled to drain select lines DSL or source select transistors coupled to source select lines SSL, and may be a positive voltage. The turn-off voltage may be used to turn off the drain select transistors or the source select transistors, and may be a ground voltage or a voltage of 0 V. The read voltage may be applied to a selected word line during a read operation, and may be set, for example, to one of various levels depending on logical page data stored in the memory cells. Source select transistors and drain select transistors may be collectively called select transistors. Similarly, source select lines and drain select lines may be collectively called select lines.

The source line driver 140 may provide a source voltage Vsl to a source line in the memory cell array 110 or allow the source line to float in response to a source line control signal SL_S. The source voltage Vsl may be a ground voltage or 0 V, a positive voltage greater than 0 V, or a negative voltage lower than 0 V. During an erase operation, the source line driver 140 may transmit an erase voltage to the source line. The erase voltage may be a voltage for decreasing the threshold voltages of the memory cells, and may be set to a positive voltage.

The control circuit 150 may output the operation signal OP_S, the row address RADD, the source line control signal SL_S, a page buffer control signal PB_S, and a column address CADD in response to a command CMD and an address ADD. For example, when an erase command is received by the control circuit 150, the control circuit 150 may control circuits in the peripheral circuit 190 so that an erase operation is performed on a selected memory block.

The control circuit 150 may output a ready/busy signal R/B in response to the command CMD. For example, the control circuit 150 may output the ready/busy signal R/B at a low level when a program operation, a read operation, or an erase operation is being performed. The control circuit 150 may output the ready/busy signal R/B at a high level when the program operation, the read operation, or the erase operation is not being performed.

The control circuit 150 may include a channel initializing circuit 155. When the operation being performed on the memory device 100 is completed or is suspended before being completed, the channel initializing circuit 155 may initialize channels of the memory block. The channel initializing circuit 155 may control the voltage generation circuit 130, the page buffer group 160, and the source line driver 140 during a channel initializing operation. For example, the channel initializing circuit 155 may control the peripheral circuit 190 to allow the channel of the corresponding memory cell string to float, discharge the word lines in the state in which the channel is floating, and discharge the channel when the word lines are discharged.

The page buffer group 160 may include a plurality of page buffers coupled to the memory cell array 110 via the bit lines BL. The page buffers may temporarily store data DATA received via the plurality of bits lines BL in response to the page buffer control signal PB_S. The page buffers may sense the voltages and/or currents of the plurality of bit lines BL during a read operation. The page buffer group 160 may generate a precharge voltage and transmit the precharge voltage to the bit lines BL.

In response to the column address CADD, the column decoder 170 may transmit data DATA received from the input/output circuit 180 to the page buffer group 160 or transmit data DATA stored in the page buffer group 160 to the input/output circuit 180. The column decoder 170 may exchange the data DATA with the input/output circuit 180 via column lines CLL. The column decoder 170 may exchange the data DATA with the page buffer group 160 via data lines DL.

The input/output circuit 180 may transfer the command CMD and the address ADD, received from, for example, the controller 1120, to the control circuit 150. During a program operation, the input/output circuit 180 may receive data from, for example, the controller 1120. During a read operation, the input/output circuit 180 may output data DATA read from selected memory cells to the controller 1120.

Figure 4:
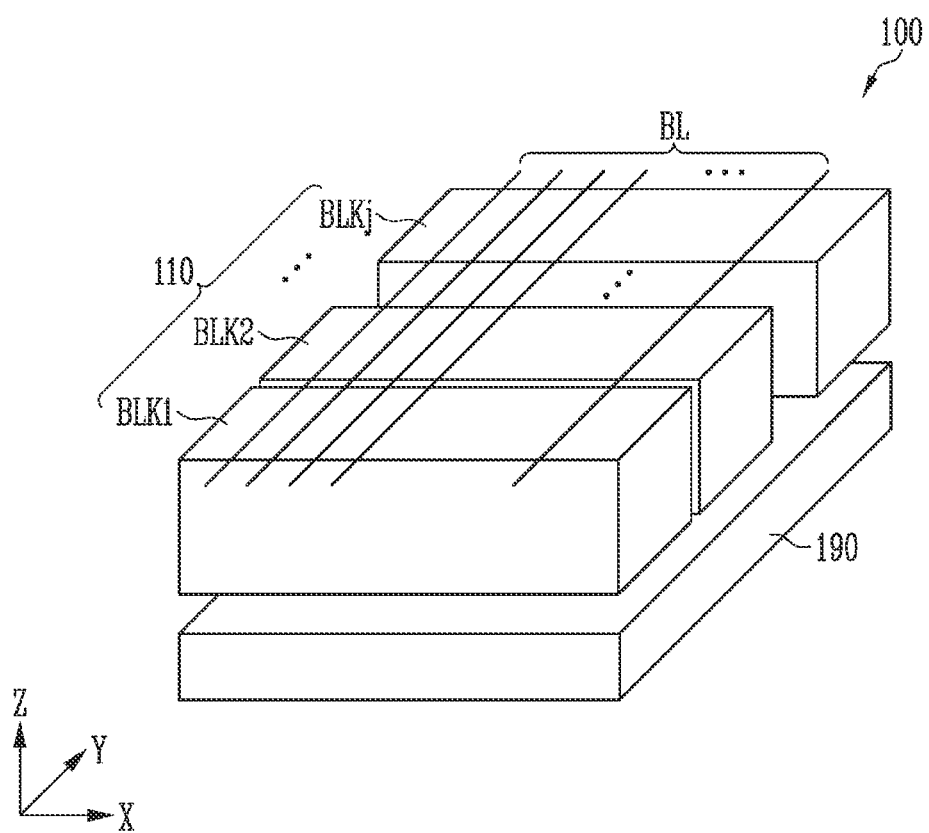
FIG. 4 is a diagram illustrating an example arrangement of a memory cell array and a peripheral circuit.

FIG. 4 is a diagram illustrating an example arrangement of a memory cell array and a peripheral circuit.

Referring to FIG. 4, the memory device 100 may include a peripheral circuit 190 and a memory cell array 110. The peripheral circuit 190 may be disposed on top of a substrate (not shown), and the memory cell array 110 may be disposed on the top of the peripheral circuit 190. The memory cell array 110 may include first to j-th memory blocks BLK1 to BLKj. A plurality of bit lines BL may be disposed on top of the first to j-th memory blocks BLK1 to BLKj.

The plurality of bit lines BL may be arranged to be spaced apart from each other in an X direction, and may extend in a Y direction. The first to j-th memory blocks BLK1 to BLKj may be arranged to be spaced apart from each other in the Y direction. The first to j-th memory blocks BLK1 to BLKj may be similar to each other, and, thus, only the first memory block BLK1 will be described in detail below.

Figure 5:
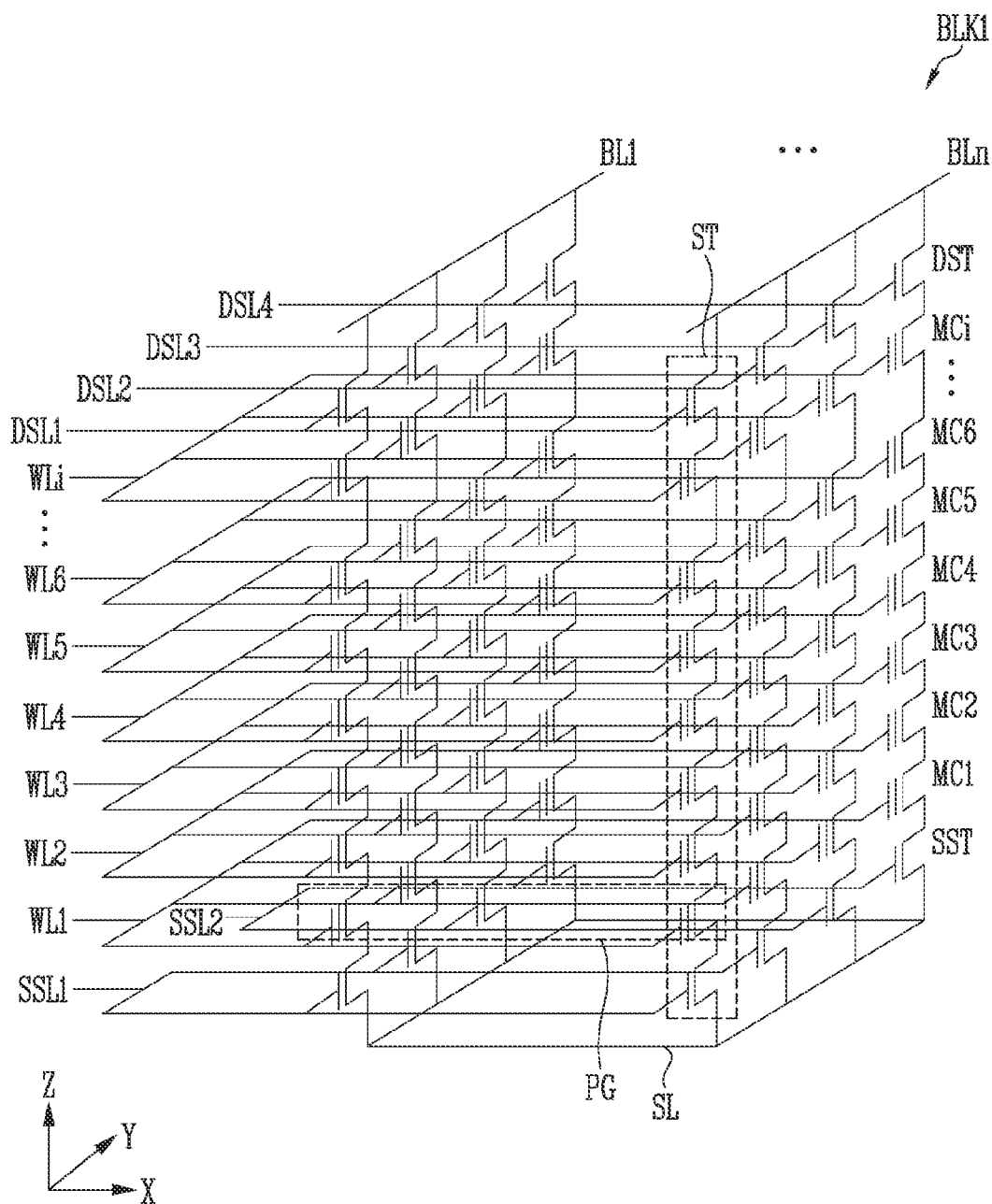
FIG. 5 is an example circuit diagram illustrating a channel initializing operation according to a first embodiment of the present disclosure.

FIG. 5 is an example circuit diagram illustrating a channel initializing operation according to a first embodiment of the present disclosure.

Referring to FIG. 5, the first memory block BLK1 may include a plurality of strings ST coupled between each of the first to n-th bit lines BL1 to BLn and a common source line SL. Because the first to n-th bit lines BL1 to BLn extend in a Y direction and are arranged to be spaced apart from each other in an X direction, the strings ST may also be arranged to be spaced apart from each other in the X and Y directions. For example, a first set of strings ST may be arranged between the first bit line BL1 and the source line SL, a second set of strings ST may be arranged between the second bit line BL2 and the source line SL, etc. In this way, an n-th set of strings ST may be arranged between the n-th bit line BLn and the source line SL. The strings ST may extend in a Z direction.

All the strings ST may be similar to each other in a memory block, and, hence, in a memory device. A string ST may include a source select transistor SST, first to i-th memory cells MC1 to MCi, and a drain select transistor DST. The number of source select transistors SST, first to i-th memory cells MC1 to MCi, and drain select transistors DST in each string ST may be different for different memory devices.

Gates of source select transistors SST in different strings may be coupled to a first or second source select line SSL1 or SSL2, and gates of the first to i-th memory cells MC1 to MCi may be coupled to first to i-th word lines WL1 to WLi, respectively, and each gate of drain select transistors DST may be coupled to one of the first to fourth drain select lines DSL1 to DSL4.

The source select transistors SST arranged in the X direction may be coupled to the same source select line, and the source select transistors SST arranged in the Y direction may be coupled to source select lines separated from each other. For example, some of the source select transistors SST arranged in the Y direction may be coupled to a first source select line SSL1, and the remaining source select transistors arranged in the Y direction may be coupled to a second source select line SSL2. The second source select line SSL2 is separate from the first source select line SSL1. Therefore, a voltage may be independently applied to the first source select line SSL1 and the second source select line SSL2.

Among the first to i-th memory cells MC1 to MCi, the memory cells formed on the same layer may be coupled to the same word line. For example, first memory cells MC1 included in different strings ST may be coupled in common to the first word line WL1, and i-th memory cells MCi included in different strings ST may be coupled in common to the i-th word line WLi. A group of memory cells that are included in different strings ST and coupled to the same word line may be a page (PG). Program and read operations may be performed on a page (PG) basis, and pre-program and erase operations may be performed on a memory block basis. The operation performed on a memory block basis may be performed on all pages included in a selected memory block.

Drain select transistors DST arranged in the Y direction may be coupled to first to fourth drain select lines DSL1 to DSL4 separated from each other. In detail, the drain select transistors DST arranged in the X direction may be coupled to the same drain select line, and the drain select transistors DST arranged in the Y direction may be coupled to first to fourth drain select lines DSL1 to DSL4 separated from each other. Since the first to fourth drain select lines DSL1 to DSL4 are separated from each other, different voltages may be applied independently to first to fourth drain select lines DSL1 to DSL4.

Figure 6:
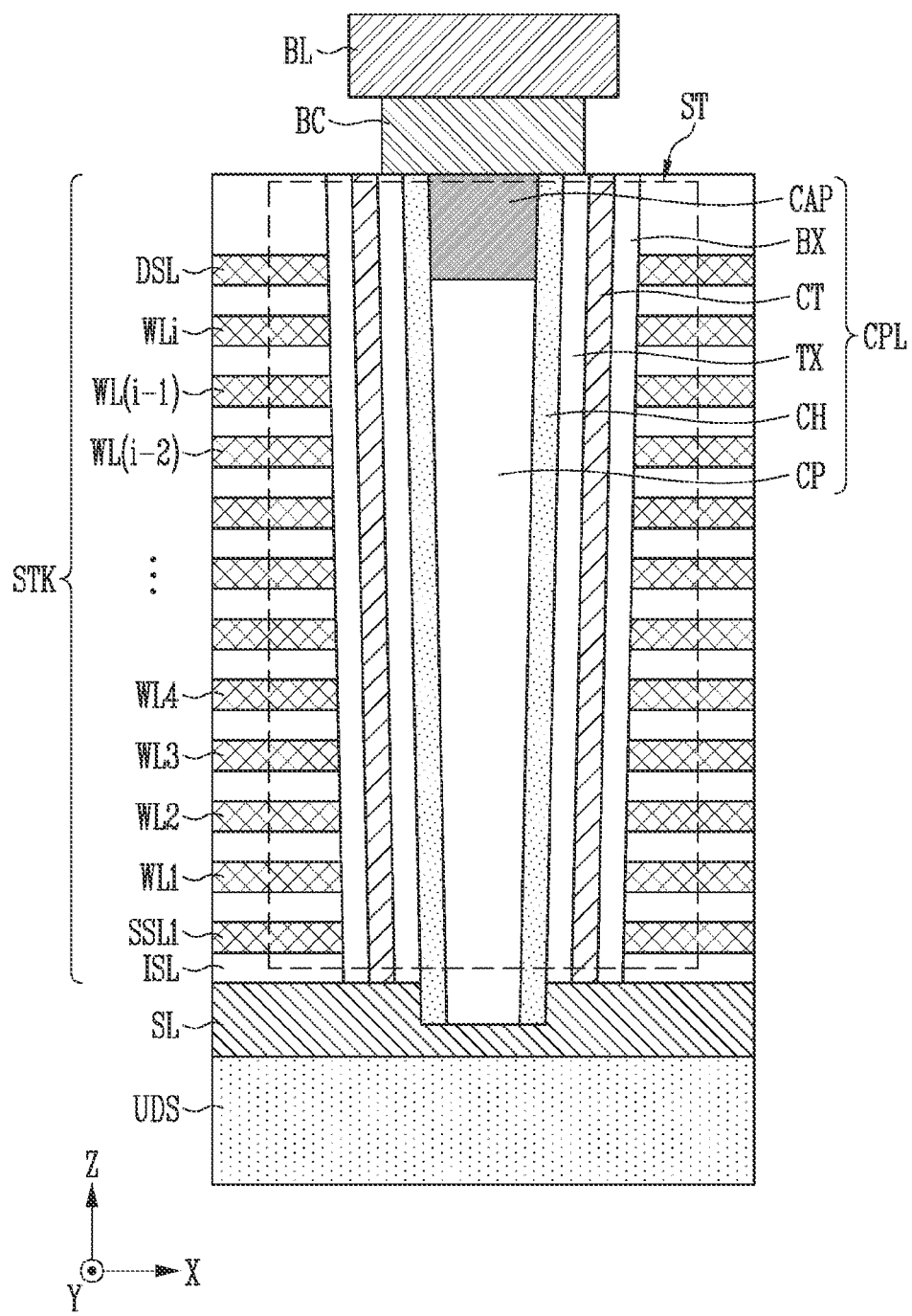
FIG. 6 is a diagram illustrating an example structure of a string illustrated in FIG. 5.

FIG. 6 is a diagram illustrating an example structure of a string illustrated in FIG. 5.

Referring to FIG. 6, a source line SL may be formed on a lower structure UDS, and a stacked structure STK may be formed on the source line SL. The lower structure UDS may be a substrate or a peripheral circuit. The source line SL may be formed of a conductive material. For example, the source line SL may be formed of polysilicon. The stacked structure STK may include gate lines and insulating layers ISL formed between the gate lines. The gate lines may include a source select line SSL, first to i-th word lines WL1 to WLi, and a drain select line DSL. The gate lines may be formed of conductive material. For example, the gate lines may be formed of conductive material such as tungsten (W), molybdenum (Mo), cobalt (Co), nickel (Ni), etc. and/or semiconductor material such as silicon (Si), polysilicon (Poly-Si), etc. The gate lines may be formed of various types of metal materials in addition to the above-described materials. Each of the insulating layers ISL may be an oxide layer or a silicon oxide layer. A gate line next above the source line SL may be the source select line SSL. Some of the gate lines stacked on the source select line SSL may be the first to i-th word lines WL1 to WLi, and a gate line formed on the i-th word line WLi may be the drain select line DSL.

The string ST may be formed of a cell plug CPL penetrating the stacked structure STK. The cell plug CPL may include a blocking layer BX, a charge trap layer CT, a tunnel isolation layer TX, a channel layer CH, a core pillar CP, and a capping layer CAP. The blocking layer BX may be formed in the shape of a cylinder penetrating the stacked structure STK, and may be formed of an oxide layer or a silicon oxide layer. The charge trap layer CT may be formed in the shape of a cylinder along an inner wall of the blocking layer BX, and may be formed of a nitride layer. The tunnel isolation layer TX may be formed in the shape of a cylinder along an inner wall of the charge trap layer CT, and may be formed of an oxide layer or a silicon oxide layer. The channel layer CH may be formed in the shape of a cylinder along an inner wall of the tunnel isolation layer TX, and may be formed of polysilicon. The core pillar CP may be formed in the shape of a cylinder filling the channel layer CH, and may be made of an insulating material such as an oxide layer or a silicon oxide layer. The capping layer CAP may be formed in the shape of a cylinder on the core pillar CP, and may be made of a conductive material. When the capping layer CAP is formed on the core pillar CP, the height of the top surface of the core pillar CP may be formed to be lower than that of the top surface of the channel layer CH, and the capping layer CAP may be formed in a region on the core pillar CP enclosed by the channel layer CH.

A bit line contact BC and the bit line BL may be formed on the cell plug CPL. For example, the bit line contact BC may be made of conductive material and may contact the channel layer CH. The bit line BL may be formed on the bit line contact BC, and may be formed of a conductive material.

Figure 7A:
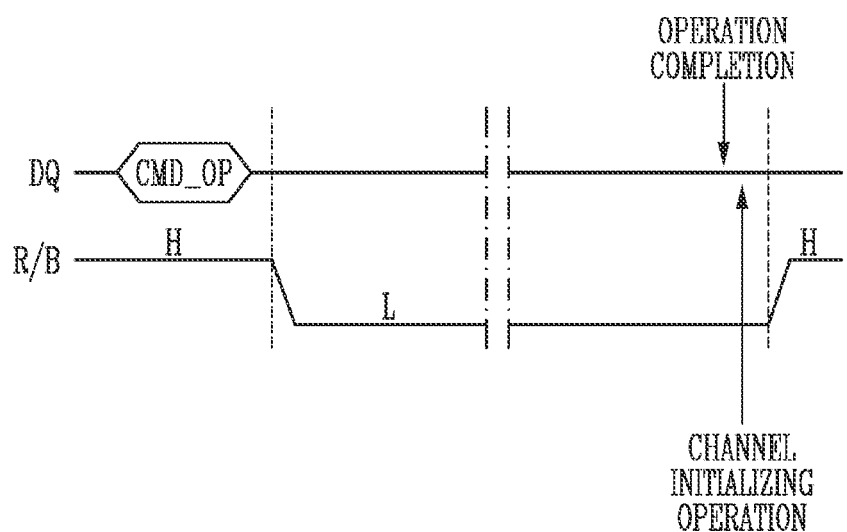
FIGS. 7A and 7B are diagrams that each illustrates a time during which an example channel initializing operation is performed.
Figure 7B:
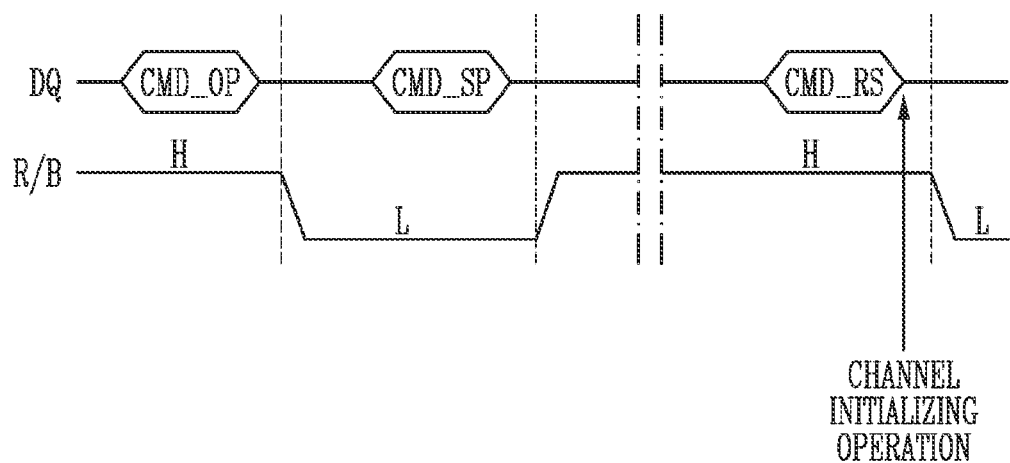

FIGS. 7A and 7B are diagrams that each illustrates a time during which an example channel initializing operation is performed.

Referring to FIG. 7A, when an operation command CMD_OP is received by a memory device via the input/output lines DQ, the memory device may change a ready/busy signal R/B having a high level H to a ready/busy signal R/B having a low level L. The memory device may then perform an operation corresponding to the received operation command CMD_OP. For example, the operation command CMD_OP may be a program command, an erase command, or a read command.

When the program, erase, or read operation is completed, the memory device may perform a channel initializing operation before changing the ready/busy signal R/B having a low level L to the ready/busy signal R/B having a high level H. The channel initializing operation may initialize the channel voltages of strings in a memory block on which the program, erase, or read operation is performed. For example, the word lines may be discharged to perform a next operation on the selected memory block. However, the channel voltages applied to the channels of the strings may be excessively decreased due to coupling to the word lines. Therefore, in a present embodiment, the channel initializing operation may be performed to prevent the channel voltages from being excessively decreased. For example, in the channel initializing operation, when the channel voltages are increased, the channels may float, and the word lines may be discharged in the state in which the channels are floating.

Referring to FIG. 7B, when an operation command CMD_OP is received by the memory device via the input/output lines DQ, the memory device may change a ready/busy signal R/B having a high level H to a ready/busy signal R/B having a low level L in response to the operation command, and may perform an operation corresponding to the operation command CMD_OP. For example, the operation command CMD_OP may be a program command or an erase command.

When a suspend command CMD_SP is input before the program or erase operation is completed, that is, while the program or erase operation is being performed, the memory device may suspend the operation being performed, and may change the ready/busy signal R/B having a low level L to the ready/busy signal R/B having a high level H.

When a resume command CMD_RS is received via the input/output lines DQ, the memory device may perform a channel initializing operation on the memory block on which the operation is suspended, and may subsequently resume the suspended operation. The channel initializing operation may be to initialize the channel voltages of strings in the memory block on which the operation is suspended. For example, the word lines may be discharged to resume the suspended operation. In this case, channel voltages, indicating the voltages of channels of the strings, may be excessively decreased due to coupling to the word lines. Therefore, in a present embodiment, the channel initializing operation may be performed to prevent the channel voltages from being excessively decreased. For example, during the channel initialization operation, after the voltages of the channels have increased to a positive voltage greater than 0 V, the word lines may be discharged.

An operation command CMD_OP may be received by the memory device that is in a suspend state due to the suspend command CMD_SP. For example, a read command may be received by the memory device. In this case, the memory device may perform a read operation in response to the read command, and the ready/busy signal R/B may have a low level L. When the read operation is completed, the memory device may change the ready/busy signal R/B back to a high level H.

Operations described with reference to FIG. 7B will be described in further detail below.

Figure 8:
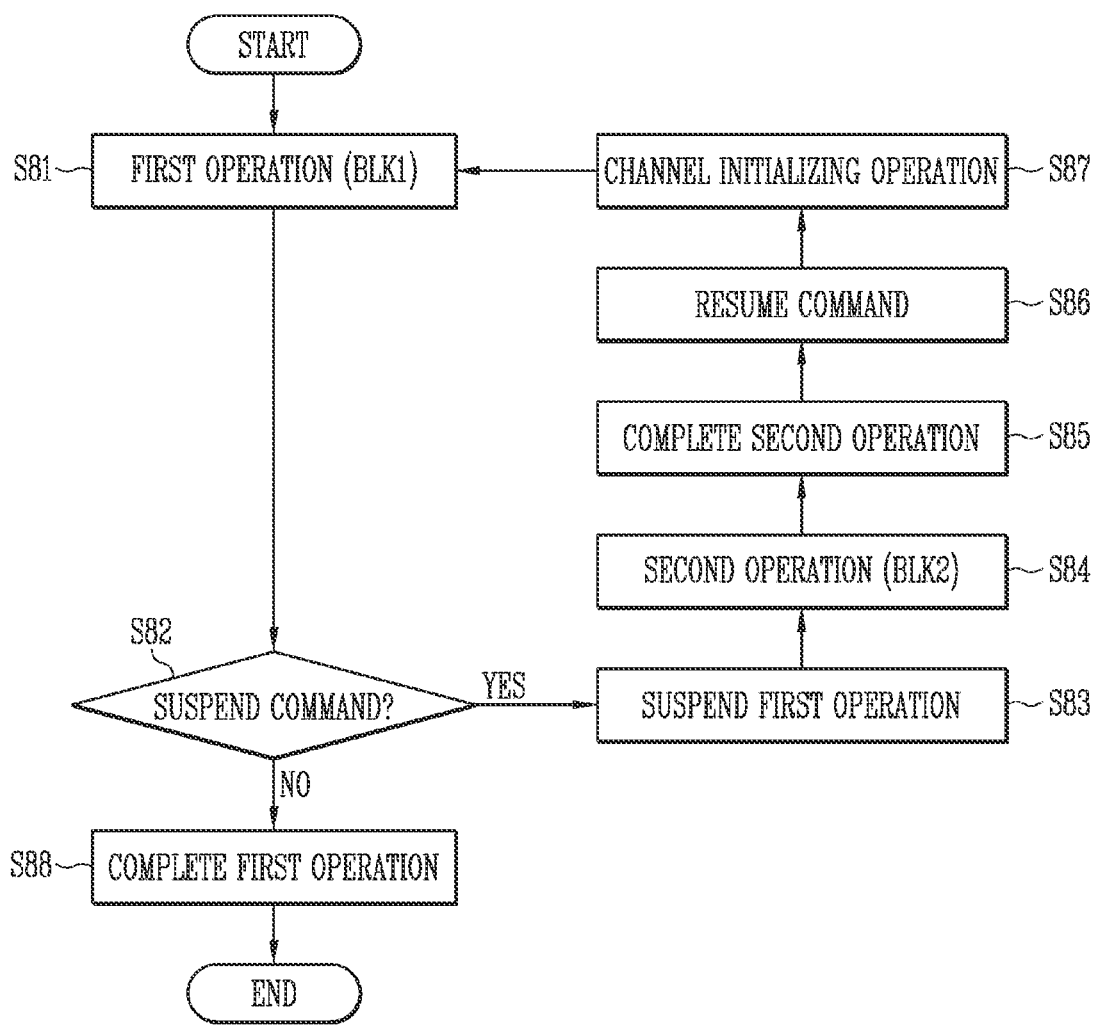
FIG. 8 is a flowchart illustrating an example method of operating a memory device according to an embodiment of the present disclosure.

FIG. 8 is a flowchart illustrating an example method of operating a memory device according to an embodiment of the present disclosure.

Referring to FIG. 8, when an operation command is received by the memory device, the memory device may perform a first operation at step S81. For example, the first operation may be a program operation or an erase operation.

At step S82, when a suspend command is received by the memory device while the first operation is being performed, the memory device may suspend the first operation at step S83.

When an operation command for a second operation is received by the memory device after the first operation is suspended, the memory device may perform the second operation at step S84. For example, the second operation may be a read operation. A memory block selected in the second operation may be different from a memory block selected in the first operation. For example, when the memory block selected in the first operation is a first memory block BLK1, the memory block selected in the second operation may be a second memory block BLK2 different from the first memory block BLK1. It should be noted that the first and second memory blocks BLK1 and BLK2 are examples. The first and second operations may occur in other memory blocks selected by addresses input to the memory device in the first and second operations.

When the second operation is completed at step S85, and a resume command is received by the memory device at step S86, the memory device may perform a channel initializing operation on the first memory block BLK1 at step S87. The channel initializing operation may increase the potential of the channel layer before discharging word lines coupled to the first memory block BLK1. That is, during the channel initializing operation, in order to prevent the potential of the channel layer from being excessively decreased, a channel voltage, which is the potential of the channel layer, may be increased to a positive voltage. Therefore, during the channel initializing operation, after the channel voltages have increased to the positive voltage, the word lines may be discharged.

When the channel initializing operation at step S87 is completed, the suspended first operation may be performed at step S81. In some embodiments, the first operation may continue from a point subsequent to a step suspended at step S83, while other embodiments may start again at an initial step of the first operation.

At step S82, when a suspend command is not received, the first operation may be performed until the first operation is completed at step S88.

Figure 9:
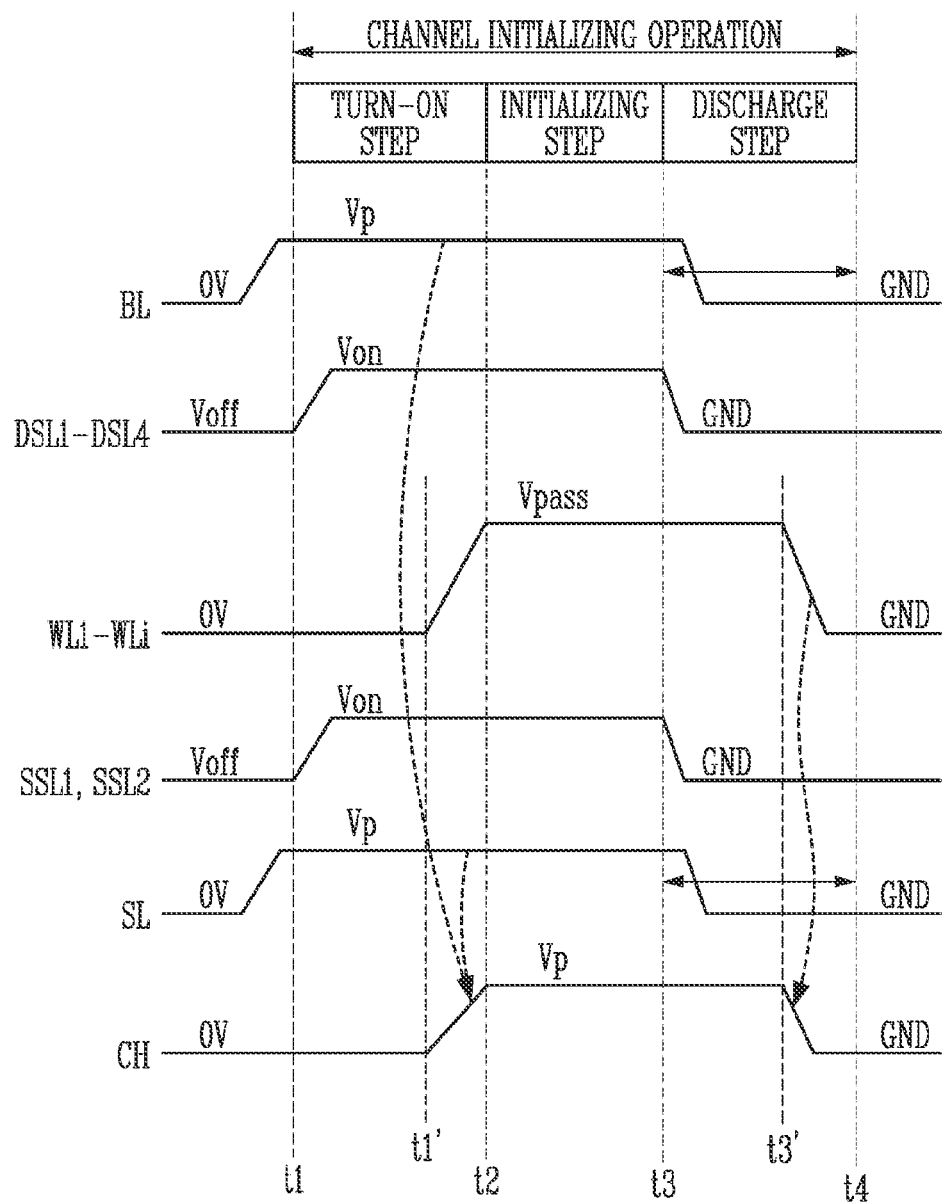
FIG. 9 is a timing diagram illustrating a channel initializing operation according to the first embodiment of the present disclosure.

FIG. 9 is a timing diagram illustrating a channel initializing operation according to a first embodiment of the present disclosure.

Referring to FIG. 9, the channel initializing operation may include a turn-on step, an initializing step, and a discharge step.

The turn-on step may be performed during a period from time t1 to time t2. When the turn-on step starts at time t1, a precharge voltage Vp greater than 0 V may be applied to the bit lines BL and the source line SL, and a turn-on voltage Von may be applied to all drain select lines DSL1 to DSL4 and all source select lines SSL1 and SSL2 that are coupled to a selected memory block. For example, assuming that the first to fourth drain select lines DSL1 to DSL4 and the first and second source select lines SSL1 and SSL2 are coupled to the selected memory block, the turn-on voltage Von may be applied to the first to fourth drain select lines DSL1 to DSL4 and the first and second source select lines SSL1 and SSL2. The turn-on voltage Von may be a positive voltage greater than 0 V, and may be set to a positive voltage that enables turning on first to fourth drain select transistors coupled to the first to fourth drain select lines DSL1 to DSL4 and first and second source select transistors coupled to the first and second source select lines SSL1 and SSL2.

In some embodiments, the precharge voltage Vp may be applied to the bit lines BL and the source line SL before time t1. When the turn-on voltage Von is applied to the first to fourth drain select lines DSL1 to DSL4 and the first and second source select lines SSL1 and SSL2, a voltage of 0 V may be applied to the first to i-th word lines WL1 to WLi.

Because all of the memory cells are turned off due to the voltage of 0 V applied to the first to i-th word lines WL1 to WLi, the voltage of the channel layer CH may be maintained at 0 V even if the turn-on voltage Von is applied to the first to fourth drain select lines DSL1 to DSL4 and the first and second source select lines SSL1 and SSL2 and the precharge voltage Vp is applied to the bit lines BL and the source line SL.

At time t1' before the turn-on step is completed, a pass voltage Vpass may be applied to the first to i-th word lines WL1 to WLi. The pass voltage Vpass may be a positive voltage greater than 0 V, and may be set to a positive voltage that enables the memory cells coupled to the first to i-th word lines WL1 to WLi to be turned on. When the pass voltage Vpass is applied to the first to i-th word lines WL1 to WLi, a current path may be formed between the memory cells, whereby the precharge voltage Vp may be supplied to the channel layer CH.

When the pass voltage Vpass applied to the first to i-th word lines WL1 to WLi has increased to a target level, the initializing step may be performed.

The initializing step may be performed during a period from time t2 to time t3. At the initializing step, the pass voltage Vpass applied to the first to i-th word lines WL1 to WLi and the turn-on voltage Von applied to the first to fourth drain select lines DSL1 to DSL4 and the first and second source select lines SSL1 and SSL2 may be maintained for a period of time. Therefore, the precharge voltage Vp supplied to the channel layer CH may also be maintained while the initializing step is being performed. After the initializing step is performed, the discharge step may be performed. The period of time may be dependent on design and/or implementation criteria including the technology used for the memory cells. Accordingly, the period of time may be predetermined.

The discharge step may be performed during a period from time t3 to time t4. When the discharge step starts at time t3, the first to fourth drain select lines DSL1 to DSL4 and the first and second source select lines SSL1 and SSL2 may be discharged. When the potentials of the first to fourth drain select lines DSL1 to DSL4 and the first and second source select lines SSL1 and SSL2 become a ground voltage GND, the first to fourth drain select transistors and the first and second source select transistors may be turned off. Subsequently, the bit lines BL and the source line SL may be discharged. In the timing diagram illustrated in FIG. 9, although the bit lines BL and the source line SL are discharged after the first to fourth drain select lines DSL1 to DSL4 and the first and second source select lines SSL1 and SSL2 are discharged, the first to fourth drain select lines DSL1 to DSL4, the first and second source select lines SSL1 and SSL2, the bit lines BL, and the source line SL may be simultaneously discharged. Other embodiments may change the time when the bit lines BL and the source line SL are discharged to other times within the period from time t3 to time t4.

Because the first to fourth drain select transistors and the first and second source select transistors are turned off, the channel layer CH of each of the strings may float. The first to i-th word lines WL1 to WLi may be discharged at time t3' before the discharge step is terminated at time t4. When the first to i-th word lines WL1 to WLi are discharged while the channel layer CH is floating, the potential of the channel layer CH may also be decreased due to coupling of the channel layer CH to the first to i-th word lines WL1 to WLi. Excessive decrease of the potential of the channel layer CH may lead to a potential of less than 0 V, which may reduce reliability of the subsequent resume operation.

However, because the potential of the channel layer CH is the precharge voltage Vp at the initializing step, the potential of the channel layer CH may not decrease excessively even when the potential of the channel layer CH is decreased. That is, at the discharge step, the voltage of the channel layer CH may not decrease to a level lower than 0 V. Accordingly, the potential of the channel layer CH may be maintained at 0 V or a level close to 0V, thus preventing deterioration of the reliability of the subsequent resume operation.

Figure 10:
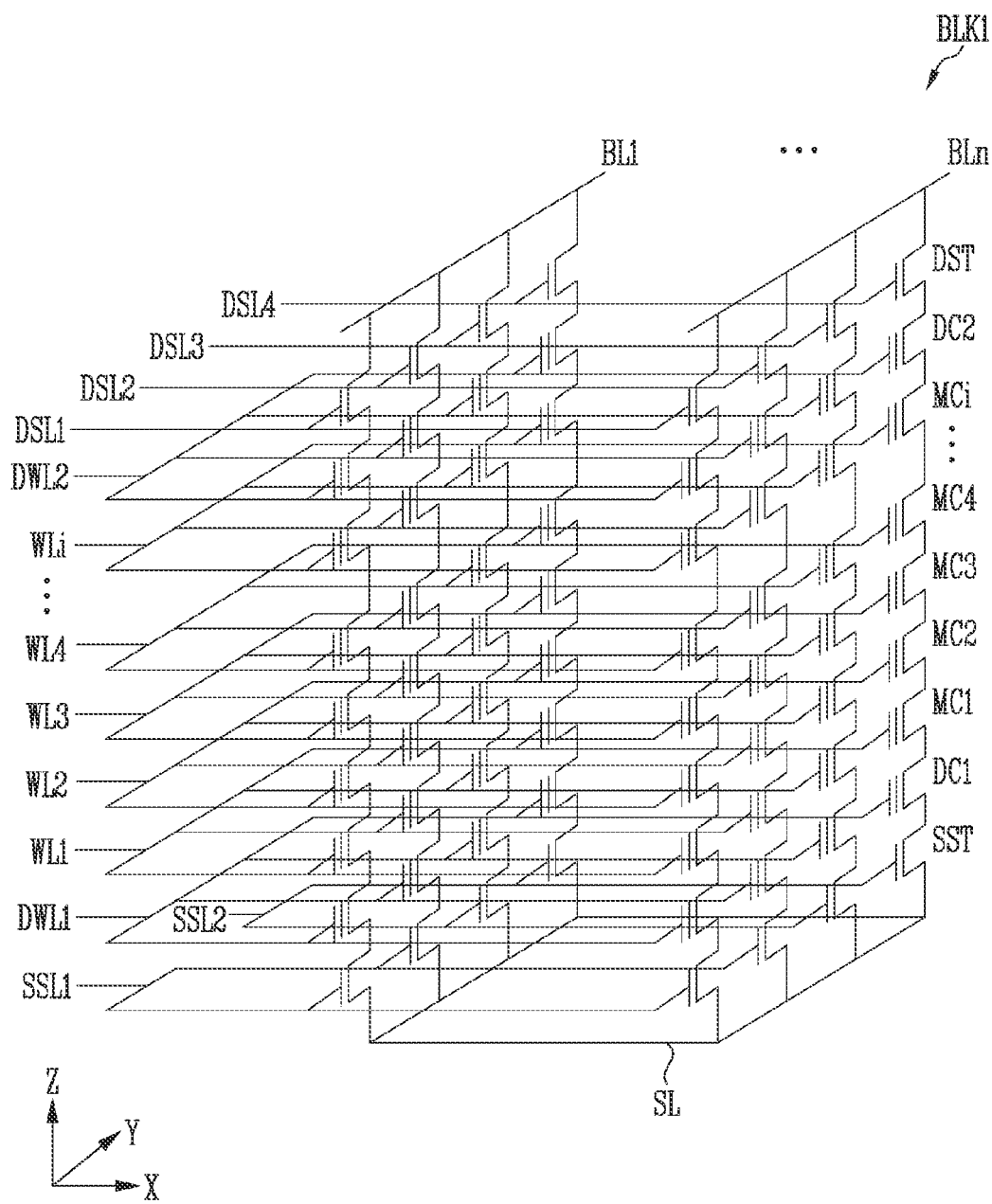
FIG. 10 is a circuit diagram illustrating a channel initializing operation according to a second embodiment of the present disclosure.

FIG. 10 is a circuit diagram illustrating a channel initializing operation according to a second embodiment of the present disclosure.

Referring to FIG. 10, the first memory block BLK1 may have a first dummy cell DC1 coupled between a first memory cell MC1 and a source select transistor SST, and a second dummy cell DC2 coupled between an i-th memory cell MCi and a drain select transistor DST. The first and second dummy cells DC1 and DC2 may be cells in which dummy data is stored rather than user data, and may be used to improve electrical reliability in a first memory block BLK1. Gates of the first dummy cells DC1 included in strings may be coupled to a first dummy line DWL1, and gates of the second dummy cells DC2 may be coupled to a second dummy line DWL2. The first and second dummy cells DC1 and DC2 are not limited to the example illustrated in FIG. 10. Rather, one or more dummy cells may be coupled in series between the memory cells and the source select transistor or the drain select transistor.

The first memory block BLK1 illustrated in FIG. 10 is similar to the first memory block BLK1 illustrated in FIG. 5 except for the dummy cells DC1 and DC2 and the dummy lines DWL1 and DWL2. Therefore, further descriptions of the first memory block BLK1 will be omitted.

Figure 11:
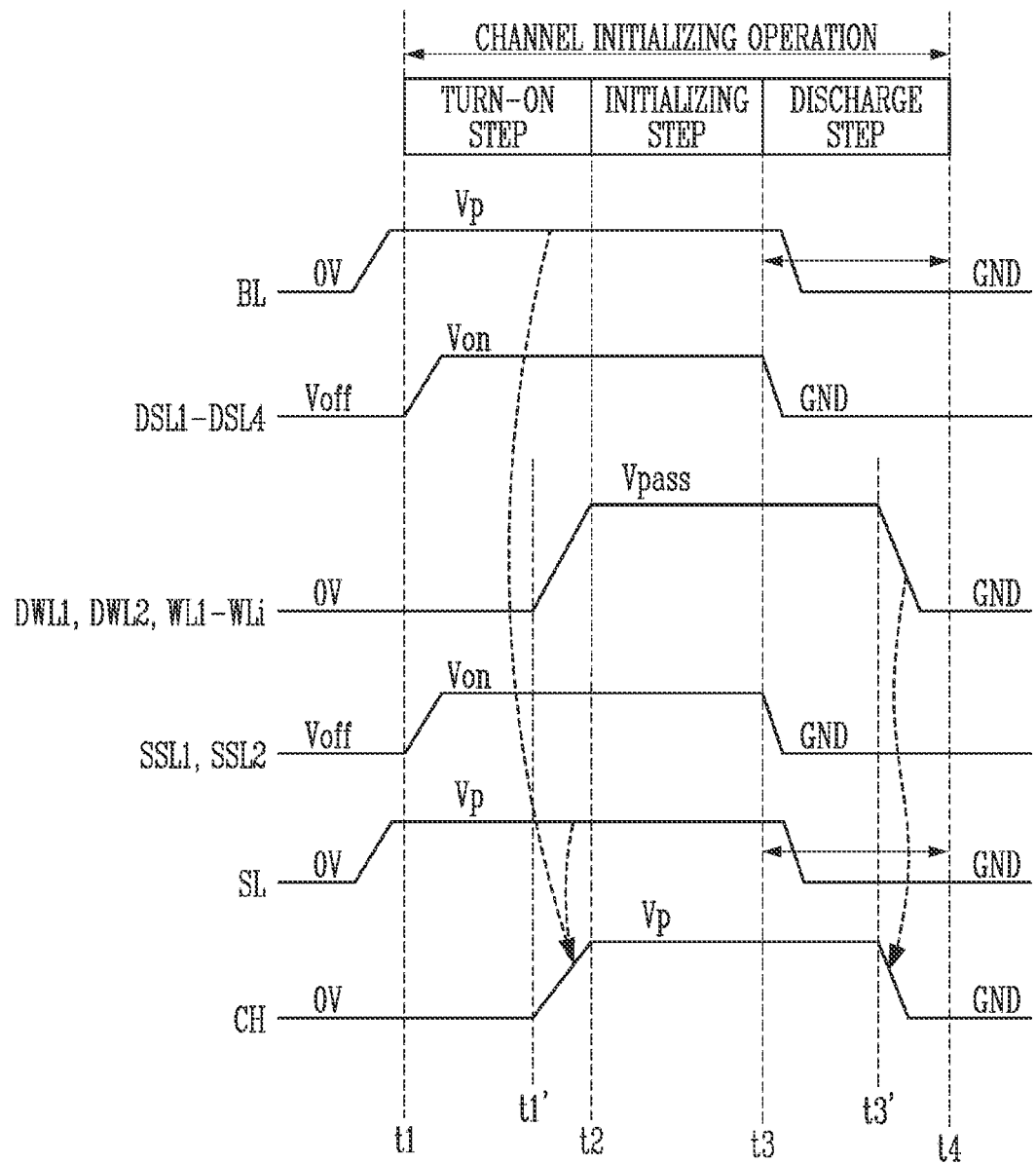
FIG. 11 is a timing diagram illustrating a channel initializing operation according to the second embodiment of the present disclosure.

FIG. 11 is a timing diagram illustrating a channel initializing operation according to the second embodiment of the present disclosure.

Referring to FIG. 11, the channel initializing operation may include a turn-on step, an initializing step, and a discharge step.

The turn-on step may be performed during a period from time t1 to time t2. When the turn-on step starts at time t1, a precharge voltage Vp greater than 0 V may be applied to bit lines BL and a source line SL, and a turn-on voltage Von may be applied to all drain select lines DSL1 to DSL4 and all source select lines SSL1 and SSL2 that are coupled to a selected memory block. For example, assuming that the first to fourth drain select lines DSL1 to DSL4 and the first and second source select lines SSL1 and SSL2 are coupled to the selected memory block, the turn-on voltage Von may be applied to the first to fourth drain select lines DSL1 to DSL4 and the first and second source select lines SSL1 and SSL2. The turn-on voltage Von may be a positive voltage greater than 0 V, and may be set to a positive voltage that enables turning on the first to fourth drain select transistors coupled to the first to fourth drain select lines DSL1 to DSL4 and the first and second source select transistors coupled to the first and second source select lines SSL1 and SSL2.

In some embodiments, the precharge voltage Vp may be applied to the bit lines BL and the source line SL before time t1. When the turn-on voltage Von is applied to the first to fourth drain select lines DSL1 to DSL4 and the first and second source select lines SSL1 and SSL2, a voltage of 0 V may be applied to first and second dummy lines DWL1 and DWL2 and first to i-th word lines WL1 to WLi.

Because all of the dummy cells and the memory cells are turned off due to the voltage of 0 V applied to the first and second dummy lines DW1 and DW2 and the first to i-th word lines WL1 to WLi, the voltage of the channel layer CH may be maintained at 0 V even if the turn-on voltage Von is applied to the first to fourth drain select lines DSL1 to DSL4 and the first and second source select lines SSL1 and SSL2 and the precharge voltage Vp is applied to the bit lines BL and the source line SL.

At a time t1f before the turn-on step is completed, the pass voltage Vpass may be applied to the first and second dummy lines DW1 and DW2 and the first to i-th word lines WL1 to WLi. The pass voltage Vpass may be a positive voltage greater than 0 V that enables the dummy cells coupled to the first and second dummy lines DW1 and DW2 and the memory cells coupled to the first to i-th word lines WL1 to WLi to be turned on. When the pass voltage Vpass is applied to the first and second dummy lines DW1 and DW2 and the first to i-th word lines WL1 to WLi, a current path may be formed between the memory cells whereby the precharge voltage Vp may be supplied to the channel layer CH.

When the pass voltage Vpass applied to the first and second dummy lines DW1 and DW2 and the first to i-th word lines WL1 to WLi has increased to a target level, the initializing step may be performed.

The initializing step may be performed during a period from time t2 to time t3. At the initializing step, the pass voltage Vpass applied to the first and second dummy lines DW1 and DW2 and the first to i-th word lines WL1 to WLi and the turn-on voltage Von applied to the first to fourth drain select lines DSL1 to DSL4 and the first and second source select lines SSL1 and SSL2 may be maintained for a period of time. Therefore, the precharge voltage Vp supplied to the channel layer CH may also be maintained while the initializing step is being performed. After the initializing step is performed for the certain time, the discharge step may be performed. The period of time may be dependent on design and/or implementation criteria including the technology used for the memory cells. Accordingly, the period of time may be predetermined.

The discharge step may be performed during a period from time t3 to time t4. When the discharge step starts at time t3, the first to fourth drain select lines DSL1 to DSL4 and the first and second source select lines SSL1 and SSL2 may be discharged. When the potentials of the first to fourth drain select lines DSL1 to DSL4 and the first and second source select lines SSL1 and SSL2 become a ground voltage GND, the first to fourth drain select transistors and the first and second source select transistors may be turned off. Subsequently, the bit lines BL and the source line SL may be discharged. In the timing diagram illustrated in FIG. 11, although the bit lines BL and the source line SL are discharged after the first to fourth drain select lines DSL1 to DSL4 and the first and second source select lines SSL1 and SSL2 are discharged, the first to fourth drain select lines DSL1 to DSL4, the first and second source select lines SSL1 and SSL2, the bit lines BL, and the source line SL may be simultaneously discharged. Other embodiments may change the time when the bit lines BL and the source line SL are discharged may be changed to other times within the period from time t3 to time t4.

Because the first to fourth drain select transistors and the first and second source select transistors are turned off, the channel layer CH of each of the strings may float. The first and second dummy lines DW1 and DW2 and the first to i-th word lines WL1 to WLi may be discharged at time t3' before the discharge step is terminated at time t4. When the first and second dummy lines DW1 and DW2 and the first to i-th word lines WL1 to WLi are discharged while the channel layer CH is floating, the potential of the channel layer CH may also be decreased due to coupling of the channel layer CH to the first and second dummy lines DW1 and DW2 and the first to i-th word lines WL1 to WLi. Excessive decrease of the potential of the channel layer CH may lead to a potential of less than 0 V, which may reduce reliability of the subsequent resume operation.

However, because the potential of the channel layer CH is the precharge voltage Vp at the initializing step, the potential of the channel layer CH may not decrease excessively even when the potential of the channel layer CH is decreased. That is, at the discharge step, the voltage of the channel layer CH may not decrease to a level lower than 0 V. Accordingly, the potential of the channel layer CH may be maintained at 0 V or a level close to 0V, thus preventing deterioration of the reliability of the subsequent resume operation.

Figure 12:
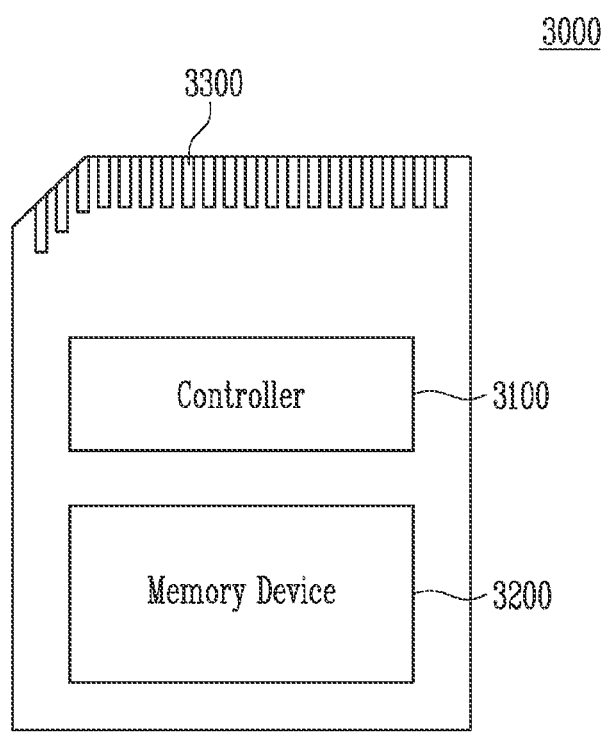
FIG. 12 is a diagram illustrating an example memory card system that may use a memory device according to an embodiment of the present disclosure.

FIG. 12 is a diagram illustrating an example memory card system that may use a memory device according to an embodiment of the present disclosure.

Referring to FIG. 12, a memory card system 3000 may include a controller 3100, a memory device 3200, and a connector 3300.

The controller 3100 may be coupled to the memory device 3200 and may be able to access the memory device 3200. For example, the controller 3100 may control a program, a read, or an erase operation of the memory device 3200, or may control a background operation of the memory device 3200. The controller 3100 may provide an interface between the memory device 3200 and a host. The controller 3100 may execute firmware for controlling the memory device 3200. In an example, the controller 3100 may include components, such as a random access memory (RAM), a processor, a host interface, a memory interface, an error correction block, etc.

The controller 3100 may communicate with an external device via the connector 3300. The controller 3100 may communicate with the external device (e.g., a host) based on a specific communication standard. In an embodiment, the controller 3100 may communicate with the external device using at least one of various communication standards such as universal serial bus (USB), multimedia card (MMC), embedded MMC (EMMC), peripheral component interconnection (PCI), PCI-express (PCI-E), advanced technology attachment (ATA) protocol, serial-ATA (SATA), parallel-ATA (PATA), small computer system interface (SCSI), enhanced small disk interface (ESDI), integrated drive electronics (IDE), FIREWIRE, universal flash storage (UFS), WIFI, BLUETOOTH, nonvolatile memory express (NVME), etc. In an embodiment, the connector 3300 may be defined by at least one of the above-described various communication standards.

The memory device 3200 may include memory cells, and may be configured in the same manner as the memory device 100 illustrated in FIG. 3.

The controller 3100 and the memory device 3200 may be integrated into a single semiconductor device to form a memory card. For example, the controller 3100 and the memory device 3200 may be integrated into a single semiconductor device, and may then form a memory card such as a personal computer (PC) memory card, a compact flash card (CF), a smart media card (SM or SMC), a memory stick, a multimedia card (MMC, RS-MMC, MMCmicro or EMMC), an SD card (SD, miniSD, microSD, or SDHC), or a universal flash storage (UFS).

Figure 13:
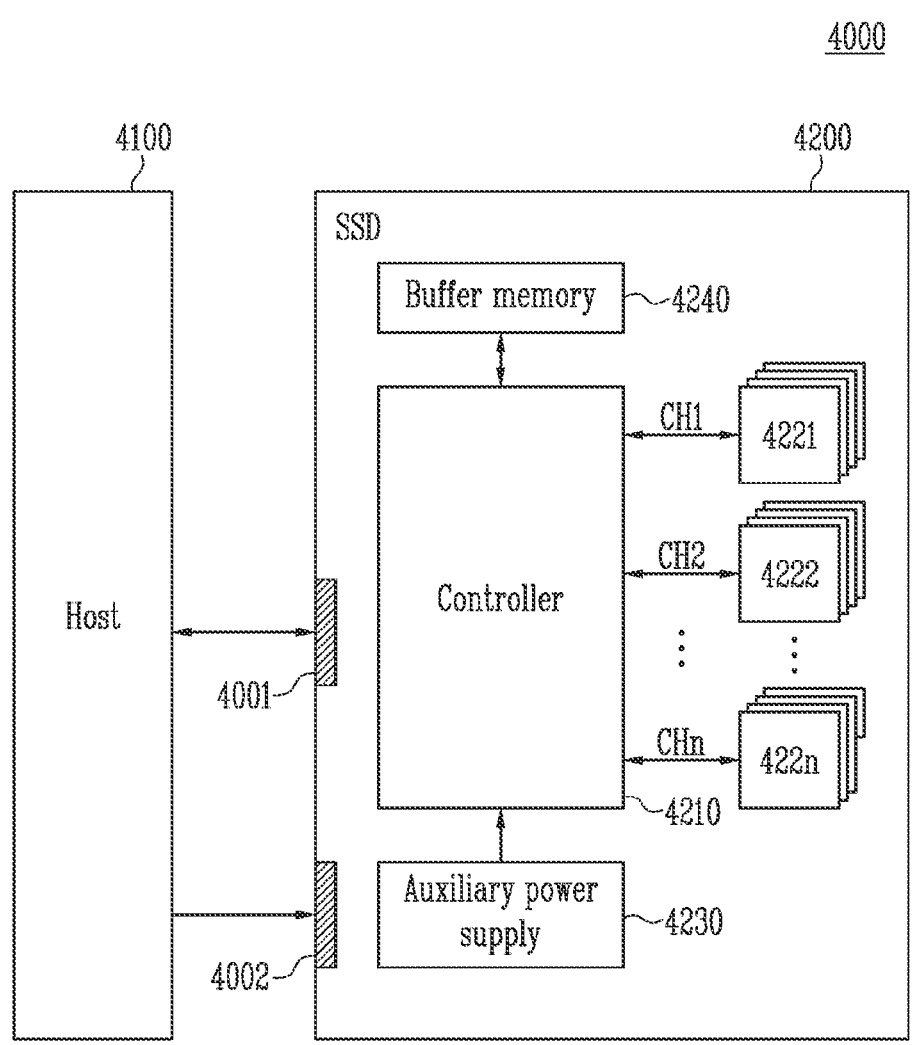
FIG. 13 is a diagram illustrating a solid state drive (SSD) system that may use a memory device according to an embodiment of the present disclosure.

FIG. 13 is a diagram illustrating a solid state drive (SSD) system that may use a memory device according to an embodiment of the present disclosure.

Referring to FIG. 13, an SSD system 4000 may include a host 4100 and an SSD 4200. The SSD 4200 may communicate with the host 4100 via a signal connector 4001, and may receive power via a power connector 4002. The SSD 4200 may include a controller 4210, a plurality of memory devices 4221 to 422n where 'n' may represent one or more digits, an auxiliary power supply 4230, and a buffer memory 4240.

The controller 4210 may control the plurality of memory devices 4221 to 422n in response to signals received from the host 4100. In an embodiment, the received signals may be signals based on the interfaces of the host 4100 and the SSD 4200. For example, the signals may be defined by at least one of various interfaces such as universal serial bus (USB), multimedia card (MMC), embedded MMC (EMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), FIREWIRE, universal flash storage (UFS), WIFI, BLUETOOTH, nonvolatile memory express (NVME), etc.

Each of the plurality of memory devices 4221 to 422n may include cells in which data can be stored. Each of the memory devices 4221 to 422n may be configured in the same manner as the memory device 100 illustrated in FIG. 3.

The auxiliary power supply 4230 may be coupled to the host 4100 via the power connector 4002. The auxiliary power supply 4230 may be supplied with a supply voltage by the host 4100, and may be charged. The auxiliary power supply 4230 may provide the supply voltage of the SSD 4200 when the supply of power from the host 4100, for example, is not within specification. In an embodiment, the auxiliary power supply 4230 may be located inside the SSD 4200 or located outside the SSD 4200. For example, the auxiliary power supply 4230 may be located on a main board external to the SSD 4200 that may also provide auxiliary power to the SSD 4200.

The buffer memory 4240 may function as a buffer memory of the SSD 4200. For example, the buffer memory 4240 may temporarily store data received from the host 4100 or data received from the plurality of memory devices 4221 to 422n, or may temporarily store metadata (e.g., mapping tables) of the memory devices 4221 to 422n. The buffer memory 4240 may include volatile memories such as dynamic random access memory (DRAM), synchronous DRAM (SDRAM), double data rate (DDR) SDRAM, low power DDR (LPDDR) SDRAM, etc., or nonvolatile memories such as ferroelectric RAM (FRAM), resistive RAM (ReRAM), spin transfer torque magnetic RAM (STT-MRAM), phase-change RAM (PRAM), etc.

In accordance with the present disclosure, various embodiments have been described that may increase the reliability of a memory device. Additionally, while various embodiments may have been described with ground voltage of 0 volts, other embodiments may have a "ground" that is not 0 volts.

What is claimed is:

1. A memory device, comprising:
a string including select transistors and memory cells coupled in series between a bit line and a source line;
a voltage generation circuit configured to:
provide a turn-on voltage or a turn-off voltage to select lines coupled to the select transistors; and
provide at least one operating voltage to word lines coupled to the memory cells, or discharge the select lines or the word lines;
a page buffer configured to precharge or discharge the bit line, wherein when the select transistors are turned off in response to the turn-off voltage, the page buffer discharges the bit line; and
a channel initializing circuit configured to control the voltage generation circuit and the page buffer to initialize a channel of the string when an operation performed on the memory cells is completed or is suspended before being completed.

2. The memory device according to claim 1, wherein the memory cells are coupled between the select transistors.

3. The memory device according to claim 1, wherein, the channel initializing circuit is configured to:
apply a precharge voltage to the bit line;
turn on the select transistors;
turn off the select transistors after the select transistors are turned on for a predetermined time; and
turn off the memory cells after the select transistors are turned off.

4. The memory device according to claim 3, wherein the precharge voltage is a positive voltage greater than 0 V.

5. The memory device according to claim 1, wherein the page buffer is configured to apply a precharge voltage to the bit line to initialize the channel of the string.

6. The memory device according to claim 5, wherein the precharge voltage is a positive voltage greater than 0 V.

7. The memory device according to claim 5, wherein, in order to initialize the channel of the string, the voltage generation circuit is configured to apply the turn-on voltage to the select lines.

8. The memory device according to claim 7, wherein, in order to initialize the channel of the string, the voltage generation circuit is configured to apply a pass voltage to the word lines.

9. The memory device according to claim 8, wherein the pass voltage is a positive voltage greater than 0 V.

10. The memory device according to claim 7, wherein, when the turn-on voltage is applied for a predetermined time, the voltage generation circuit is configured to apply the turn-off voltage to the select lines.

11. The memory device according to claim 10, wherein, when the select transistors are turned off in response to the turn-off voltage, the voltage generation circuit is configured to discharge the word lines.

12. The memory device according to claim 5, further comprising:
a source line driver configured to control a voltage to be supplied to the source line.

13. The memory device according to claim 12, wherein the source line driver is configured to apply the precharge voltage to the source line to initialize the channel of the string.

14. The memory device according to claim 1, further comprising:
dummy cells coupled between the select transistors and the memory cells.

15. The memory device according to claim 14, wherein, in order to initialize the channel of the string, the voltage generation circuit is configured to, when the turn-on voltage is applied to the select lines, apply a pass voltage to the word lines coupled to the memory cells and dummy lines coupled to the dummy cells.

16. A method of operating a memory device, comprising:
performing an operation that is one of a program operation, a read operation and an erase operation on a memory block;
increasing a voltage of a channel of the memory block after the operation is completed;
allowing the channel to float after the voltage of the channel is increased; and
when the channel is floating, discharging word lines coupled to the memory block.

17. A method of operating a memory device, comprising:
performing an operation in response to a received operation command, wherein the operation command is a command to perform one of a program operation, a read operation, or an erase operation on a memory block;
suspending the operation in response to receiving a suspend command;
initializing channels of strings included in the memory block in response to receiving a resume command; and
when the channels of the strings are initialized, resuming the operation.

18. The method according to claim 17, wherein the suspend command is received while the operation is being performed on the memory device.

19. The method according to claim 17, wherein initializing the channels comprises:
applying a precharge voltage to bit lines and a source line coupled to the strings;
supplying the precharge voltage to the channels;
allowing the channels to float; and
when the channels are floating, discharging word lines coupled to memory cells of the strings.

20. The method according to claim 19, wherein, when the precharge voltage is applied to the bit lines and the source line coupled to the strings, turning off:
drain select transistors coupled between the bit lines and the memory cells; and
source select transistors coupled between the memory cells and the source line.

21. The method according to claim 19, wherein supplying the precharge voltage to the channels comprises:
turning on:
drain select transistors coupled between the bit lines and the memory cells; and
source select transistors coupled between the memory cells and the source line; and
applying a pass voltage to the word lines.

22. The method according to claim 21, wherein turning on the drain select transistors and the source select transistors comprises applying a turn-on voltage to:

drain select lines coupled to the drain select transistors; and source select lines coupled to the source select transistors.

23. The method according to claim 21, wherein the pass voltage is applied to the word lines after the drain select transistors and the source select transistors are turned on.

24. The method according to claim 21, wherein, when dummy cells are coupled between one or both of: the drain select transistors and the memory cells, and the memory cells and the source select transistors, the pass voltage is applied to dummy lines coupled to the dummy cells when the pass voltage is applied to the word lines.

25. The method according to claim 19, wherein allowing the channels to float is performed after a pre-determined time has elapsed since the precharge voltage was supplied to the channels.

26. The method according to claim 19, wherein allowing the channels to float comprises applying a turn-off voltage to:

drain select lines between the bit lines and the word lines; and source select lines between the word lines and the source line.

27. The method according to claim 19, further comprising:

after floating of the channels, discharging the bit lines and the source line.

* * * * *